(12) United States Patent
Derderian et al.

(10) Patent No.: US 6,602,796 B2
(45) Date of Patent: *Aug. 5, 2003

(54) CHEMICAL VAPOR DEPOSITION FOR SMOOTH METAL FILMS

(75) Inventors: Garo J. Derderian, Boise, ID (US); Gurtej Singh Sandhu, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/146,303

(22) Filed: Sep. 3, 1998

(65) Prior Publication Data

US 2002/0048940 A1 Apr. 25, 2002

(51) Int. Cl.$^7$ .......................... H01L 21/31; H01L 21/20
(52) U.S. Cl. ...................................... 438/758; 438/584
(58) Field of Search ................ 438/584, 603, 438/660, 688, 686, 676, 758, 765, 760, 762, 767; 427/126.1, 126.5

(56) References Cited

U.S. PATENT DOCUMENTS

| | | | |
|---|---|---|---|
| 4,818,560 A | 4/1989 | Ishihara et al. ............. 427/38 |
| 4,871,691 A | * 10/1989 | Torres et al. ...... 148/DIG. 147 |
| 5,017,543 A | 5/1991 | De Clippeleir et al. ..... 502/328 |
| 5,147,819 A | 9/1992 | Yu et al. ..................... 437/173 |
| 5,152,805 A | 10/1992 | Geddes et al. ............. 29/25.02 |
| 5,231,056 A | 7/1993 | Sandhu ........................ 437/200 |
| 5,278,100 A | 1/1994 | Doan et al. ................. 437/200 |
| 5,384,289 A | 1/1995 | Westmoreland ............. 437/245 |
| 5,558,910 A | * 9/1996 | Telford et al. .............. 427/255 |
| 5,576,071 A | 11/1996 | Sandhu ........................ 427/534 |
| 5,641,545 A | 6/1997 | Sandhu ........................ 427/573 |
| 5,661,115 A | 8/1997 | Sandhu ........................ 427/534 |
| 5,662,788 A | 9/1997 | Sandhu et al. ................. 205/87 |
| 5,730,835 A | 3/1998 | Roberts et al. ........... 156/656.1 |
| 5,733,816 A | 3/1998 | Iyer et al. ................... 438/592 |
| 5,736,422 A | 4/1998 | Lee et al. ................... 437/201 |
| 5,741,546 A | 4/1998 | Sandhu ........................ 427/255 |
| 5,856,236 A | 1/1999 | Lai et al. .................... 438/681 |
| 5,874,131 A | 2/1999 | Vaartstra et al. ............ 427/250 |
| 6,104,049 A | * 8/2000 | Solayappan et al. .......... 257/15 |

FOREIGN PATENT DOCUMENTS

| | | | |
|---|---|---|---|
| CA | 1303252 | * 6/1992 | |
| EP | 0328507 B1 | 8/1989 | ............ B01J/23/62 |
| EP | 0328507 A1 | 8/1989 | ............ B01J/23/62 |
| EP | 0751577 A3 | 1/1997 | ......... H01L/31/108 |
| EP | 0751577 A2 | 1/1997 | ......... H01L/31/108 |

* cited by examiner

Primary Examiner—Olik Chaudhuri
Assistant Examiner—Brook Kebede
(74) Attorney, Agent, or Firm—Schwegman, Lundberg, Woessner & Kluth, P.A.

(57) ABSTRACT

A method for growing smooth metal films using a first process phase favorable to nucleation, agglomeration and initiation of smooth metal film growth and a second process phase favorable to continued smooth metal film growth, a system for performing the method, and semiconductor devices so produced.

31 Claims, 4 Drawing Sheets

Fig. 4 smooth Pt

Fig. 6 rough Pt

Fig. 7

~300Å Pt on Si

CHEMICAL VAPOR DEPOSITION FOR SMOOTH METAL FILMS

FIELD OF THE INVENTION

The present invention relates to reducing surface roughness of chemical vapor deposition (CVD) films, and more specifically to the use of a multiple-step process to deposit a smooth film of metal on a semiconductor wafer at film thicknesses above about 200 Å in the fabrication of a semiconductor device.

BACKGROUND OF THE INVENTION

Integrated circuits (IC) are often fabricated with one or more semiconductor devices, which may include diodes, capacitors, and different varieties of transistors. These devices are generally fabricated by creating thin films of various materials, i.e. metals, semiconductors or insulators, upon a substrate or semiconductor wafer. The terms wafer and substrate used in the following description include any semiconductor-based structure having an exposed surface with which to form an integrated circuit or semiconductor device, and may include one or more semiconductor layers or structures which includes active or operable portions of semiconductor devices. Wafer and substrate are used interchangeably to refer to semiconductor structures during processing, and may include other layers that have been fabricated thereon. The physical characteristics and tightly controlled placement of films on a substrate will define the performance of the semiconductor device and its surrounding circuitry.

Semiconductor fabrication continues to advance, requiring finer dimensional tolerances and control. Modern integrated circuit design has advanced to the point where line width may be 0.25 microns or less. As a result, repeatability and uniformity of processes and their results is becoming increasingly important.

One important process for depositing thin films on semiconductor wafers is chemical vapor deposition or CVD. CVD is used to form a thin film of a desired material from a reaction of vapor-phase chemicals containing the chemical constituents of the material.

CVD processes operate by confining one or more semiconductor wafers in a chamber. The chamber is filled with one or more reactant gases that surround the wafer. Energy is supplied within the chamber and particularly to the reactant gases near the wafer surface. The energy activates the reactant gas chemistry to deposit a film from the gas onto the heated substrate. Such chemical vapor deposition of a solid onto a surface involves a heterogeneous surface reaction of the gaseous species that adsorb onto the surface. The rate of film growth and the quality of the film depend on the process conditions.

CVD processing typically may be low-pressure CVD (LPCVD) or plasma-enhanced CVD (PECVD). The plasma used in the PECVD is a low-pressure reactant gas that is developed in a radio frequency (RF) field. The RF plasma results in a very high electron temperature, making possible the deposition of films at lower temperatures and faster deposition rates than are typically possible using purely thermally activated CVD processes.

Deposition of a film begins with nucleation as the atoms or molecules of the desired material begin to condense on the substrate and agglomerate to form nuclei. Growth of these nuclei will fill in the gaps between individual nuclei to develop a continuous surface or film.

To obtain the desired performance characteristics of a semiconductor device, the properties of the deposited films become critical. Because of their dimension, often less than 1000 Å in thickness, the properties of thin films are strongly dependent on their surface characteristics. This result stems from the substantial increase of surface-to-volume ratio of the film material as film thickness is decreased. Films with small grain structures may have more predictable performance characteristics than those with larger grain structures.

It is generally well known that films have smaller grain size at lower film thicknesses. As film thickness is increased, larger grains generally appear. These nominally thicker films, however, are often necessary to provide adequate step coverage where the deposition process encounters high aspect ratios or steps in the substrate topology. Due to the rapidly changing geography at these step interfaces, thinner films face a larger risk that the film will be too thin in some areas to achieve the desired performance characteristics.

CVD techniques for depositing platinum on substrates often follow this pattern of increasing grain size. At film thicknesses below about 200 Å, CVD of platinum produces relatively smooth surface characteristics associated with small grain structure. As platinum film thickness is increased above about 200 Å, larger grains begin to form producing less desirable surface characteristics.

In light of the foregoing, it may be desirable to form metal films with small grain structures at thicknesses above about 200 Å in the fabrication of semiconductor devices. The invention provides a CVD technique capable of forming such metal films with grain structures smaller than those of pre-existing techniques.

SUMMARY OF THE INVENTION

The invention allows the user to form metal films through CVD at reduced grain size over pre-existing techniques for one or more metals of the platinum group or noble metals. Smooth film growth is accomplished by exploiting the differing process conditions favorable to nucleation and agglomeration versus continued small grain growth. To achieve smooth films on substrates at film thicknesses above about 200 Å, the invention discloses a multiple-phase CVD process whereby a first set of process conditions is utilized for nucleation, agglomeration and initial smooth metal film growth, and a second set of process conditions is utilized to continue smooth metal film growth.

In the first phase of the process of the invention, nucleation is initiated at a set of process conditions favorable to nucleation, agglomeration and initial smooth metal film growth. The set of process conditions in one embodiment may include pressure, oxidizer concentration and temperature. The process condition values favoring nucleation, agglomeration and initial smooth metal film growth are generally at higher levels than those favoring continued film growth with small grain structures. During this first phase, a first layer of metal film will be deposited upon the substrate or semiconductor wafer. The first process phase is allowed to continue until at least nucleation and agglomeration are complete, i.e., the first layer of metal film forms a continuous film. Subsequently, after nucleation and agglomeration are complete, but before large grain growth begins, one or more of the process conditions are altered to produce a set of process conditions favoring continued growth of a smooth metal film. Such continued growth of metal film can be thought of as depositing a second layer of metal film, although it is to be understood that the second layer of metal film deposited during the second process phase is contiguous with and uninterrupted from the first layer of metal film deposited during the first process phase.

Using the process and system of the invention, the user is capable of producing metal films on substrates or semiconductor wafers with total film thickness above about 200 Å having smoother surface characteristics, or smaller grain structure, over pre-existing CVD techniques. The user is further capable of producing semiconductor devices containing metal films with total film thickness above about 200 Å having smoother surface characteristics, or smaller grain structure, over devices produced using pre-existing CVD techniques.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and compositional changes may be made without departing from the spirit and scope of the invention. The following detailed description is, therefore, not to be taken in a limiting sense, and the scope of the invention is defined by the appended claims.

The use, construction and fundamental operation of CVD reactors for deposition of metal films are well known in the art of semiconductor fabrication. The invention may be practiced on a variety of such reactors without undue experimentation. Furthermore, detection, measurement and control of process conditions is well understood in the art of semiconductor fabrication as well as the more inclusive art of industrial processing.

Figure 1:
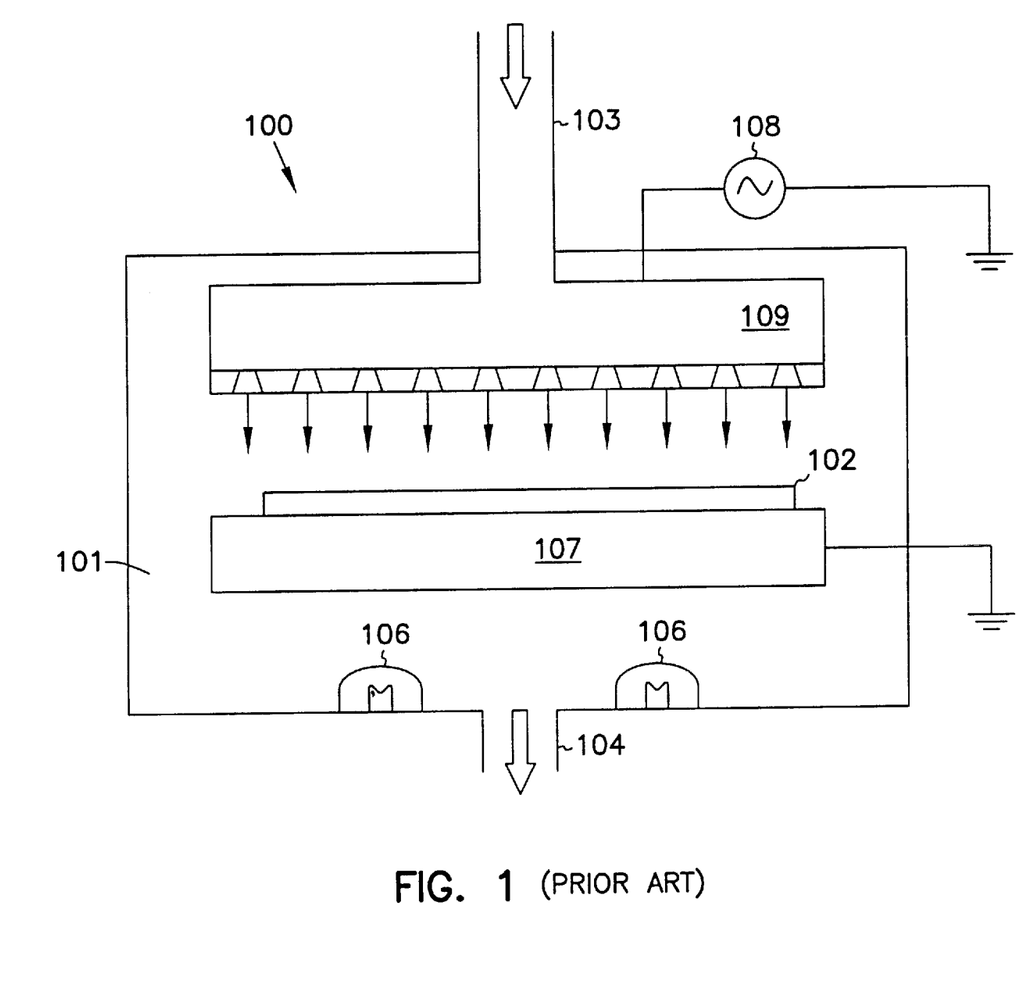
FIG. 1 is a schematic of a typical chemical vapor deposition reactor.

FIG. 1 depicts a typical chemical vapor deposition (CVD) reactor 100 suitable for practicing the invention. Chamber 101 is a pressure-sealed compartment for mounting a substrate 102 on susceptor 107. Chamber 101 is typically manufactured from aluminum and is designed to contain a low-pressure environment around substrate 102 as well as to contain process gases, exhaust gases, and plasma energy within chamber 101. Inlet gas manifold 103 supplies reactant gases at a controlled flow rate to substrate 102. Carrier gases, such as helium, argon or nitrogen, may also be supplied in conjunction with the reactant gases. Chamber 101 also incorporates a pumping system (not shown) for exhausting spent gases from chamber 101 through exhaust port 104.

CVD reactor 100 includes means for supplying energy to the reactant species in the process gases on the surface of the substrate 102. The supplied energy, hereinafter referred to as the primary energy, causes the reactant species to react or decompose and deposit a thin film onto an upper surface of substrate 102. Common means for supplying the primary energy include thermal energy supplied by heat lamps 106 in the base of chamber 101. Heat lamps 106 emit a significant amount of near-infra red radiation that passes through susceptor 107 to heat substrate 102. Alternatively, susceptor 107 can be heated by heat lamps 106 and substrate 102 can be heated by conduction from susceptor 107.

Another common method to supply the primary reaction energy is with a radio frequency (RF) generator 108 as shown in FIG. 1. RF generator 108 creates an RF field between substrate 102 and an anode. In the embodiment shown in FIG. 1, susceptor 107 is grounded while the RF signal is applied to a process gas manifold 109. Alternative and equivalent CVD reactor designs are well known. An RF anode may be provided separately (not shown) and process gas manifold 109 may be electrically isolated from the RF supply. Also, the RF signal can be applied to susceptor 107 and process gas manifold 109 can be grounded.

In general, the primary energy sources 106 and 108 are intended to provide sufficient reaction energy in a region near the surface of substrate 102 to cause decomposition and deposit of the reactant species in the process gases. Any means of supplying sufficient primary energy is adequate for the purposes of the invention.

CVD reactor 100 is illustrated as a single wafer reactor, but it should be understood that the invention is applicable to batch reactors of conventional design. The preferred embodiment includes plasma reactors because these allow film deposition at lower temperatures and are preferable in the semiconductor industry. However, some reactant species in the process gases may deposit at low temperatures using only thermal energy or other primary energy sources well known in the industry. Hence, the invention encompasses reactor designs using only a single primary energy source including either thermal heating, RF plasma, or the like.

Furthermore, CVD reactor 100 includes associated control apparatus (not shown) for detecting, measuring and controlling process conditions within CVD reactor 100. Associated control apparatus include, as examples, temperature sensors, pressure transducers, flow meters and control valves. Associated control apparatus further include other devices suitable for the detection, measurement and control of the various process conditions described herein.

Figure 2:
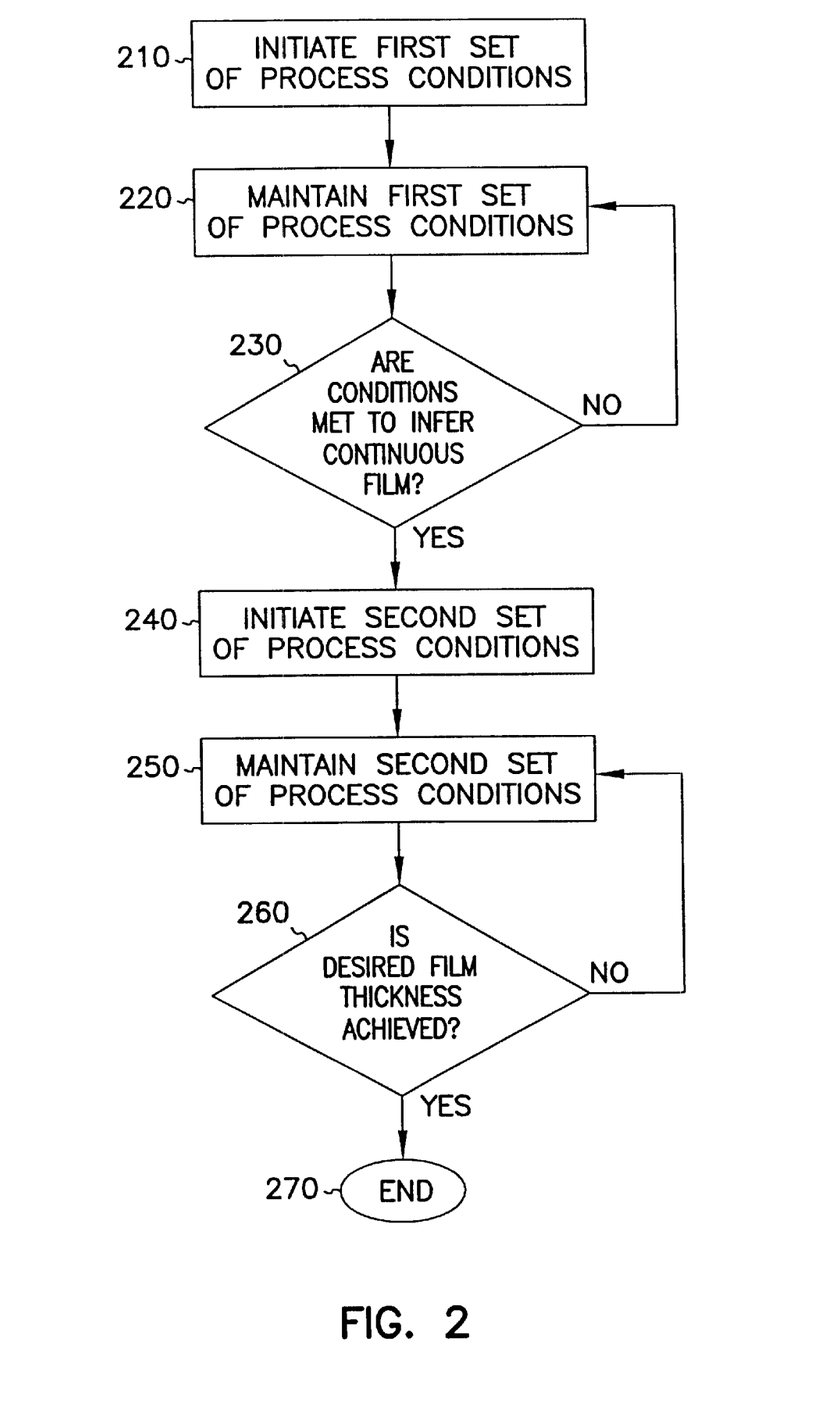
FIG. 2 is a flowchart of one embodiment of the process of the invention.

FIG. 2 depicts a flowchart 200 of one embodiment of the process of the invention. A first set of process conditions of a CVD reactor are initiated in box 210 and maintained in box 220 to begin deposition of a metal film on a substrate. Decision box 230 determines if conditions are met to infer that a continuous metal film is developed. If conditions are not met to infer a continuous film, the first set of process conditions is maintained in box 220. If conditions are met to infer a continuous film, a second set of process conditions is initiated in box 240. Upon transfer of control to box 240, the second set of process conditions is maintained in box 250 for continuing deposition of the metal film. A further decision box 260 may determine if conditions are met to infer that a desired metal film thickness is achieved. If conditions are not met, the second set of process conditions are maintained in box 250. If conditions are met, the process is terminated in box 270. The reader should note that process termination may comprise initiation of further processing and does not necessarily require shutdown of the CVD reactor.

The flowchart 200 may be utilized to develop suitable instructions for control of a CVD reactor as is readily within the skill of those skilled in the art of industrial process control. In one embodiment, instructions for control of a CVD reactor comprise first instructions for initiating and maintaining a first set of process conditions to begin depositing a metal film, second instructions for allowing for development of continuous film, and third instructions for initiating and maintaining a second set of process conditions for continuing deposition of the metal film.

Figure 3:
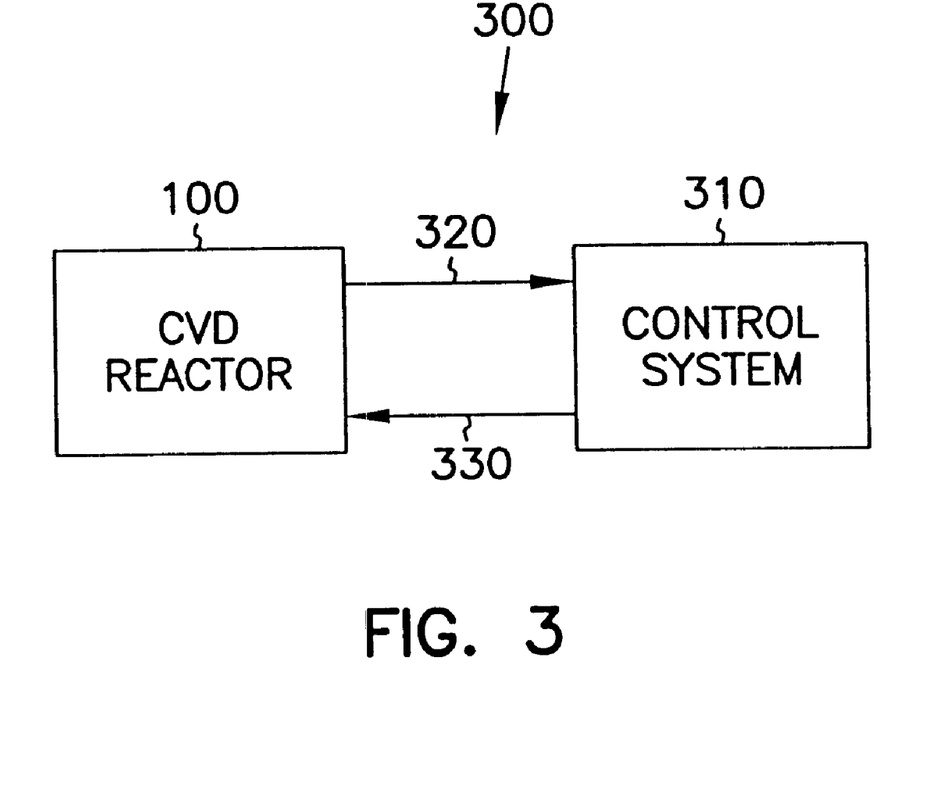
FIG. 3 is a block diagram of a chemical vapor deposition system of one embodiment of the invention.

FIG. 3 represents a CVD system 300 suitable for practicing the invention. CVD system 300 contains a CVD reactor 100 and a control system 310. CVD reactor 100 and control system 310 are in communication such that process information is passed from CVD reactor 100 to control system 310 through communication line 320, and process control information is passed from control system 310 to CVD reactor 100 through communication line 330. It is noted that communication lines 320 and 330 may represent only one physical line, communications being bidirectional.

In one embodiment of the invention, control system 310 is physically associated with CVD reactor 100 and in communication with CVD reactor 100, but no external communication or control is necessary for operation of CVD reactor 100. In a further embodiment, control system 310 is in communication with CVD reactor 100, but is not physically associated with CVD reactor 100. Examples include distributed and centralized industrial process control systems, as are well known in the art, wherein communication is typically across a shared external communication channel.

In another embodiment of the invention, instructions for control of CVD system 300 in accordance with the process of the invention are stored on a machine readable medium (not shown). In a further embodiment of the invention, the machine readable medium is contained in control system 310 and in communication (not shown) with control system 310. In yet another embodiment of the invention, the machine readable medium is in communication (not shown) with control system 310, but not physically associated with control system 310.

Figure 4:
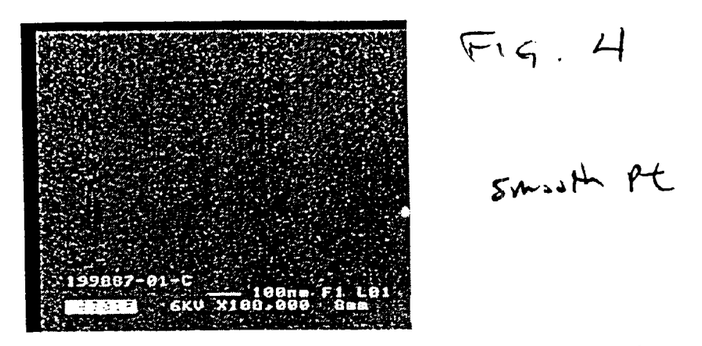
FIG. 4 is a micrograph of a top planar view of the surface of a smooth platinum film.
Figure 5:
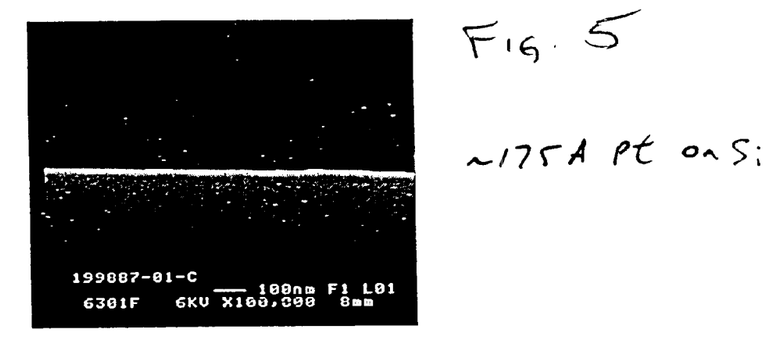
FIG. 5 is a micrograph of a cross-sectional view of the smooth platinum film of FIG. 4.
Figure 6:
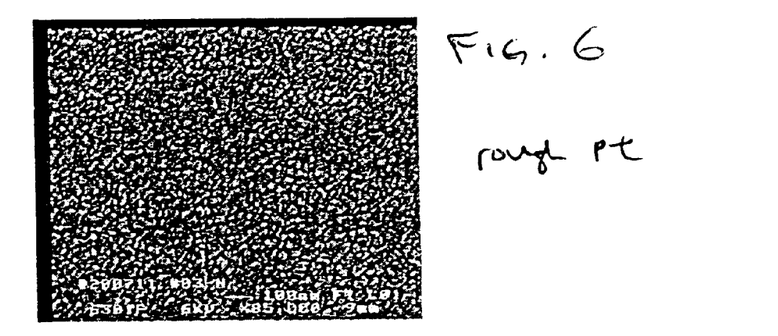
FIG. 6 is a micrograph of a top planar view of the surface of a rough platinum film.
Figure 7:
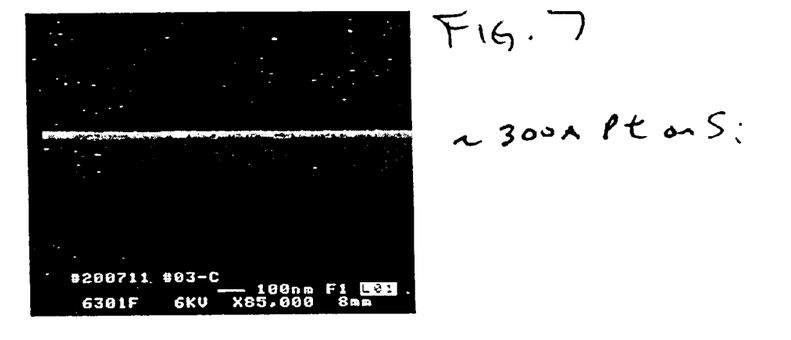
FIG. 7 is a micrograph of a cross-sectional view of the rough platinum film of FIG. 6.

Pre-existing CVD processes are capable of producing smooth platinum films at thicknesses at or below about 200 Å. FIGS. 4 and 5 show a smooth platinum film at about 175 Å produced using pre-existing CVD processing on a silicon substrate. Upon exceeding a thickness of about 200 Å, pre-existing CVD processes will begin to produce platinum films exhibiting rough surface characteristics. FIGS. 6 and 7 show the rough surface characteristics of an about 300 Å thick platinum film produced using pre-existing CVD processing on a silicon substrate.

In an exemplary embodiment of the invention, smooth platinum films are formed on a substrate at film thicknesses above about 200 Å. Such films exhibit grain sizes comparable to those of pre-existing CVD processes for platinum films at or below about 200 Å.

In one embodiment of the invention, nucleation of metal deposition is initiated in a first process phase at a first set of process conditions favorable to nucleation, agglomeration and initial smooth metal film growth. Subsequent to development of a continuous film, continued film growth occurs in a second process phase at a second set of process conditions favorable to continued growth of smooth metal film. The second set of process conditions differs from the first set of process conditions.

In another embodiment, the deposited metal is one of the platinum-group metals, i.e., platinum, palladium, rhodium, ruthenium or iridium. In a further embodiment, the deposited metal is one of the noble metals, i.e., rhenium, ruthenium, rhodium, palladium, silver, osmium, iridium, platinum or gold. In a still further embodiment, the deposited metal is platinum.

In one embodiment of the invention, initiation of the second process phase occurs before large-grain growth occurs. In another embodiment, initiation of the second process phase occurs upon reaching a desired film thickness of the first layer of metal film. In yet another embodiment, the desired film thickness of the first layer of metal film is below about 200 Å. In still another embodiment, the desired film thickness of the first layer of metal film is above about 100 Å. In a further embodiment, the second process phase is initiated after a desired active time of the first process phase, wherein such desired active time is sufficient to routinely produce a continuous metal film under the first set of process conditions. In a still further embodiment, initiation of the second process phase is determined based on cumulative feed of a reactant during the first process phase, wherein the cumulative feed of the reactant is sufficient to routinely produce a continuous metal film under the first set of process conditions. Those skilled in the art will recognize that determination of parameters that will routinely produce a desired result in a defined process is common practice to industrial processing, and does not represent undue experimentation. The routine production of a desired result represents a confidence level by the user that the likelihood and benefit of achieving the result outweighs the cost of failing to achieve the result.

In another embodiment of the invention, nucleation of metal deposition is initiated in a first process phase at a first temperature favorable to nucleation, agglomeration and initial smooth metal film growth. Subsequent to development of a continuous film, continued film growth occurs in a second process phase with a second temperature favorable to continued growth of smooth metal film. In yet another embodiment, the second temperature is at a lower value than the first temperature. In a further embodiment, the first, second or both temperatures are variable.

In still another embodiment of the invention, nucleation of metal deposition is initiated in a first process phase at a first pressure favorable to nucleation, agglomeration and initial smooth metal film growth. Subsequent to development of a continuous film, continued film growth occurs in a second process phase at a second pressure favorable to continued growth of smooth metal film. In a further embodiment, the second pressure is at a lower value than the first pressure. In another embodiment, the first, second or both pressures are variable.

In a still further embodiment of the invention, nucleation of metal deposition is initiated in a first process phase at a first oxidizer concentration favorable to nucleation, agglomeration and initial smooth metal film growth. Subsequent to development of a continuous film, continued film growth occurs at a second oxidizer concentration favorable to continued growth of smooth metal film. In yet another embodiment of the invention, the second oxidizer concentration is at a lower value than the first oxidizer concentration. In another embodiment, the first, second or both oxidizer concentrations are variable. In a further embodiment, the oxidizer is oxygen, ozone or nitrous oxide.

In one embodiment of the invention, altering a set of process conditions involves altering multiple process conditions. By altering a process condition it is meant that a process condition in the second process phase differs from its corresponding process condition in the first process phase, e.g., process temperature would be altered if the operating temperature in the second process phase differed in value from the operating temperature in the first process phase, either higher or lower. In another embodiment, altering of multiple process conditions includes altering temperature and pressure. In yet another embodiment, altering of multiple process conditions includes altering temperature and oxidizer concentration. In still another embodiment, altering of multiple process conditions includes altering pressure and oxidizer concentration. In a further embodiment, altering of multiple process conditions includes altering temperature, pressure and oxidizer concentration.

In another embodiment, a semiconductor device is fabricated containing a metal film, wherein nucleation of metal deposition is initiated in a first process phase at a first set of process conditions favorable to nucleation, agglomeration and initial smooth metal film growth. A first layer of metal film is deposited during this first process phase. Subsequent to development of a continuous film, continued film growth occurs in a second process phase at a second set of process conditions favorable to continued growth of smooth metal film. A second layer of metal film is deposited during this second process phase. The second layer of metal film is deposited on the first layer of metal film, forming a contiguous and uninterrupted metal film having a combined thickness of the first and second layers.

In a further embodiment, a CVD system is provided to deposit a metal film on a substrate, wherein the system contains a machine readable medium having instructions stored thereon for causing the system to perform the process of the invention. Accordingly, in one embodiment, the CVD system contains a machine readable medium having instructions stored thereon for causing the system to initiate nucleation of metal deposition in a first process phase at a first set of process conditions favorable to nucleation, agglomeration and initial smooth metal film growth, thus depositing a first layer of metal film; to allow for development of a continuous film; and to continue depositing metal film in a second process phase at a second set of process conditions favorable to continued growth of smooth metal film, thus depositing a second layer of metal film.

Although specific embodiments have been illustrated and described herein, it will be appreciated by those of ordinary skill in the art that any arrangement which is calculated to achieve the same purpose may be substituted for the specific embodiments shown. For example, the present invention is not so limited to the exemplary embodiments. Furthermore, those skilled in the art will recognize that process conditions may be altered multiple times or continuously during each process phase, herein referred to as variable process conditions, without departing from the scope of the invention provided that such variable process conditions at any given time during a process phase do not produce a set of process conditions that is counterproductive to the goals of that process phase, i.e., nucleation, agglomeration and initial smooth metal film growth during the first process phase, or continued growth of smooth metal film during the second process phase. In addition, other suitable process conditions may be altered in practice of this invention. Some examples may include choice of reactant, reactant concentration, magnetic field, RF signal strength, radiant heat source, radiation wavelength, choice of carrier gas, carrier gas concentration, choice of catalyst, catalyst concentration and other process conditions known or likely to affect development of metal film formation. Furthermore, those skilled in the art will recognize that control of one process condition may directly affect another process condition, i.e., control of a gaseous feed rate would directly affect the concentration of all gas-phase components, and control of temperature in a closed system would directly affect pressure. Accordingly, altering of process conditions is intended to include those process conditions directly controlled by the user as well as those process conditions that are altered in direct response to those controlled by the user. Therefore, this application is intended to cover any adaptations or variations of the present invention and it is manifestly intended that this invention be limited only by the claims and the equivalents thereof.

CONCLUSION

The invention allows the user to form metal films through CVD at reduced grain size over pre-existing techniques for one or more metals of the platinum group or noble metals. Such smooth metal films may offer improved performance characteristics at high surface-to-volume ratios. Smooth film growth is accomplished by exploiting the differing process conditions favorable to nucleation and agglomeration versus continued small grain growth. To achieve smooth films on substrates at film thicknesses above about 200 Å, the invention incorporates a multiple-phase CVD process whereby a first set of process conditions is utilized for nucleation, agglomeration and initial smooth metal film growth, and a second set of process conditions is utilized to continue smooth metal film growth.

What is claimed is:

1. A method of forming a single element metal film, comprising:
    depositing a single element metal film by chemical reaction at a first set of process conditions, the first set of process conditions producing a grain size in the single element metal film;
    allowing for development of a continuous film; and
    continuing to deposit the single element metal film by chemical reaction, at a second set of process conditions, wherein the second set of process conditions differs from the first set of process conditions, wherein the second set of process conditions preserves the grain size.

2. The method of claim 1 wherein depositing the metal film at the first set of process conditions comprises operating at a first temperature, a first pressure and a first oxidizer concentration.

3. The method of claim 2 wherein depositing the metal film at the first set of process conditions further comprises feeding a reactant at a first reactant feed rate.

4. A method of forming a single element metal film, comprising:
    depositing a single element metal film by chemical reaction at a first set of process conditions, the first set of process conditions producing a grain size in the single element metal film;
    allowing for development of a continuous film;
    continuing to deposit the single element metal film by chemical reaction, at a second set of process conditions, wherein the second set of process conditions differs from the first set of process conditions, wherein the second set of process conditions preserves the grain size; and
    wherein depositing the metal film at the first set of process conditions comprises operating at a first temperature, a first pressure and a first oxidizer concentration; and
    wherein continuing to deposit the metal film at the second set of process conditions comprises operating at a second temperature, a second pressure and a second oxidizer concentration.

5. The method of claim 4 wherein operating at the second temperature comprises operating at a temperature altered from the first temperature.

6. The method of claim 5 wherein operating at the second temperature further comprises operating at a temperature having a lower value than the first temperature 7. A method of forming a single element metal film, comprising:
   depositing a single element metal film by chemical reaction at a first set of process conditions, the first set of process conditions producing a grain size in the single element metal film;
   allowing for development of a continuous film;
   continuing to deposit the single element metal film by chemical reaction, at a second set of process conditions, wherein the second set of process conditions differs from the first set of process conditions, wherein the second set of process conditions preserves the grain size; and
   wherein depositing the metal film at the first set of process conditions comprises operating at a first temperature, a first pressure and a first oxidizer concentration; and
   wherein continuing to deposit the metal film at the second set of process conditions comprises operating at a second temperature, a second pressure and a second oxidizer concentration; and
   wherein operating at the second pressure comprises operating at a pressure altered from the first pressure.

8. The method of claim 7 wherein operating at the second pressure further comprises operating at a pressure having a lower value than the first pressure.

9. A method of forming a single element metal film, comprising:
   depositing a single element metal film by chemical reaction at a first set of process conditions, the first set of process conditions producing a grain size in the single element metal film;
   allowing for development of a continuous film;
   continuing to deposit the single element metal film by chemical reaction, at a second set process conditions, wherein the second set of process conditions differs from the first set of process conditions, wherein the second set of process conditions preserves the grain size; and
   wherein depositing the metal film at the first set of process conditions comprises operating at a first temperature, a first pressure and a first oxidizer concentration;
   wherein continuing to deposit the metal film at the second set of process conditions comprises operating at a second temperature, a second pressure and a second oxidizer concentration; and
   wherein operating at the second oxidizer concentration comprises operating at an oxidizer concentration altered from the first oxidizer concentration.

10. The method of claim 9 wherein operating at the second oxidizer concentration further comprises operating at an oxidizer concentration having a lower value than the first oxidizer concentration.

11. The method of claim 4 wherein operating at the first and second oxidizer concentration comprises an oxidizer selected from the group consisting of oxygen, ozone and nitrous oxide.

12. The method of claim 1 wherein allowing for development of the continuous film comprises forming a metal film to a thickness above about 100 Å and below about 200 Å.

13. The method of claim 1 wherein allowing for development of the continuous film comprises operating at the first set of process conditions for a period of active time, wherein the period of active time is sufficient to routinely form a continuous film at the first set of process conditions.

14. The method of claim 3 wherein allowing for development of the continuous film comprises waiting for a cumulative feed of the reactant, wherein the cumulative feed of the reactant is sufficient to routinely form a continuous film at the first set of process conditions.

15. The method of claim 1 wherein depositing the metal film comprises depositing a film of a metal selected from the group consisting of rhenium, ruthenium, rhodium, palladium, silver, osmium, iridium, platinum and gold.

16. The method of claim 1 wherein depositing the metal film comprises depositing a film of a metal selected from the group consisting of platinum, palladium, rhodium, ruthenium and iridium.

17. The method of claim 1 wherein depositing the metal film comprises depositing a film of platinum.

18. The method of claim 1 wherein continuing to deposit the metal film comprises depositing the metal film to a thickness above about 200 Å.

19. The method of claim 1 wherein depositing the metal film at the first set of process conditions and continuing to deposit the metal film at the second set of process conditions comprise one or more process conditions selected from the group consisting of choice of reactant, reactant concentration, magnetic field, RF signal strength, radiant heat source, radiation wavelength, choice of carrier gas, carrier gas concentration, choice of catalyst and catalyst concentration.

20. The method of claim 1 wherein depositing the metal film at the first set of process conditions comprises a first set of process conditions that is variable.

21. The method of claim 1 wherein continuing to deposit the metal film at the second set of process conditions comprises a second set of process conditions that is variable.

22. A method of forming a metal film, comprising:
   depositing a single element metal film by chemical reaction at a first set of process conditions, wherein the first set of process conditions comprises a first temperature, a first pressure and a first oxidizer concentration, the first set of process conditions producing a grain size in the single element metal film;
   allowing for development of a continuous film; and
   continuing to deposit the single element metal film by chemical reaction, at a second set of process conditions until the single element metal film reaches a thickness above about 200 Å, wherein the second set of process conditions preserves the grain size, wherein the second set of process conditions comprises a second temperature, a second pressure and a second oxidizer concentration, further wherein at least one of the process conditions of the second set of process conditions is altered from its corresponding process condition of the first set of process conditions.

23. The method of claim 22 wherein continuing to deposit the metal film at the second set of process conditions comprises at least one process condition of the second set of process conditions at a lower value than its corresponding process condition of the first set of process conditions.

24. The method of claim 22 wherein depositing the metal film comprises depositing a film of a metal selected from the group consisting of rhenium, ruthenium, rhodium, palladium, silver, osmium, iridium, platinum and gold.

25. The method of claim 22 wherein depositing the metal film comprises depositing a film of a metal selected from the group consisting of platinum, palladium, rhodium, ruthenium and iridium.

26. A method of forming a metal film, comprising:

depositing a single element metal film by chemical reaction at a first set of process conditions, wherein the first set of process conditions comprises a first temperature, a first pressure and a first oxidizer concentration, the first set of process conditions producing a grain size in the single element metal film;

allowing for development of a continuous film;

continuing to deposit the single element metal film by chemical reaction, at a second set of process conditions until the single element metal film reaches a thickness above about 200 Å, wherein the second set of process conditions preserves the grain size, wherein the second set of process conditions comprises a second temperature, a second pressure and a second oxidizer concentration, further wherein at least one of the process conditions of the second set of process conditions is altered from its corresponding process condition of the first set of process conditions; and wherein depositing the metal film comprises depositing a film of platinum.

27. The method of claim 22 wherein continuing to deposit the metal film at the second set of process conditions initiates before the film thickness reaches about 200 Å.

28. The method of claim 22 wherein depositing the metal film at the first set of process conditions comprises one or more process conditions that is variable.

29. The method of claim 22 wherein continuing to deposit the metal film at the second set of process conditions comprises one or more process conditions that is variable.

30. A method of forming a metal film, comprising:

depositing a platinum film by chemical reaction at a first set of process conditions, wherein the first set of process conditions comprises a first temperature, a first pressure and a first oxidizer concentration, the first set of process conditions producing a grain size in the single element metal film;

allowing for development of a continuous film; and continuing to deposit the platinum film by chemical reaction at a second set of process conditions until the platinum film reaches a thickness above about 200 Å, wherein the second set of process conditions preserves the grain size, wherein the second set of process conditions comprises a second temperature, a second pressure and a second oxidizer concentration, further wherein at least one of the process conditions of the second set of process conditions is altered from its corresponding process condition of the first set of process conditions, still further wherein continuing to deposit the platinum film at a second set of process conditions is initiated before the platinum film reaches a thickness of about 200 Å.

31. The method of claim 30 wherein continuing to deposit the platinum film at the second set of process conditions comprises one or more process conditions of the second set of process conditions that is at a lower value than its corresponding process condition of the first set of process conditions.

* * * * *